United States Patent
Lee et al.

(10) Patent No.: US 11,469,054 B2
(45) Date of Patent: Oct. 11, 2022

(54) HIGHLY STABLE ELECTRONIC DEVICE EMPLOYING HYDROPHOBIC COATING LAYER

(71) Applicants: UNIVERSITY OF PITTSBURGH-OF THE COMMONWEALTH SYSTEM OF HIGHER EDUCATION, Pittsburgh, PA (US); GLOBAL FRONTIER CENTER FOR MULTISCALE ENERGY SYSTEMS, Seoul (KR)

(72) Inventors: Jung-Kun Lee, Sewickley Hills, PA (US); Gillsang Han, Pittsburgh, PA (US)

(73) Assignees: University of Pittsburgh-Of the Commonwealth System of Higher Education, Pittsburgh, PA (US); Global Frontier Center for Multiscale Enery Systems, Seoul (KR)

(*) Notice: Subject to any disclaimer, the term of this patent is extended or adjusted under 35 U.S.C. 154(b) by 0 days.

(21) Appl. No.: 17/109,720

(22) Filed: Dec. 2, 2020

(65) Prior Publication Data
US 2021/0090815 A1 Mar. 25, 2021

Related U.S. Application Data

(62) Division of application No. 16/098,926, filed as application No. PCT/US2017/031657 on May 9, 2017, now Pat. No. 10,892,106.
(Continued)

(51) Int. Cl.
*H01G 9/20* (2006.01)
*H01L 51/44* (2006.01)
(Continued)

(52) U.S. Cl.
CPC .......... *H01G 9/2009* (2013.01); *H01L 33/56* (2013.01); *H01L 51/448* (2013.01);
(Continued)

(58) Field of Classification Search
CPC ..... H01G 9/2009; H01L 33/56; H01L 51/448; H01L 51/5253; H01L 2251/5369;
(Continued)

(56) References Cited

U.S. PATENT DOCUMENTS 7,087,832 B2  8/2006  Scher et al.
8,709,213 B2  4/2014  Compton et al.
(Continued)

FOREIGN PATENT DOCUMENTS

EP   2693503 A1   8/2012
WO   2014045021 A1   9/2013
WO   2014151522 A1   3/2014

OTHER PUBLICATIONS

H-S. Kim et al., Lead Iodide Perovskite Sensitized All-Solid-Slate Submicron Thin Film Mesoscopic Solar Cell with Efficiency Exceeding 9%, Scientific Reports, 2: 591, DOI: 10.1038/srep 00591, pp. 1-7., Feb. 2012.
(Continued)

*Primary Examiner* — Patricia D Valenzuela
(74) *Attorney, Agent, or Firm* — Philip E. Lew; Eckert Seamans Cherin & Mellott, LLC

(57) ABSTRACT

An electronic device, such as, without limitation, a perovskite solar cell or a light emitting diode, includes an assembly including at least one electronic portion or component, and a composite coating layer covering at least part of the assembly including the at least one electronic portion or component. The composite coating layer includes a polymer material, such as, without limitation, PMMA or PMMA-PU, having nanoparticles, such as, without limitation, reduced
(Continued)

graphene oxide or $SiO_2$, embedded therein. The electronic device may further include a second coating layer including a second polymer material (such as, without limitation, PMMA or PMMA-PU without nanoparticles) positioned between the coating layer and the assembly.

21 Claims, 1 Drawing Sheet

Related U.S. Application Data

(60) Provisional application No. 62/335,845, filed on May 13, 2016.

(51) Int. Cl.
  H01L 33/56 (2010.01)
  H01L 51/52 (2006.01)
  H01L 51/56 (2006.01)

(52) U.S. Cl.
  CPC ...... H01L 51/5253 (2013.01); H01L 51/5256 (2013.01); H01L 51/56 (2013.01); H01L 2251/5369 (2013.01); Y02E 10/549 (2013.01); Y02P 70/50 (2015.11)

(58) Field of Classification Search
  CPC ..... H01L 51/56; Y02E 10/549; Y02E 10/542; Y02P 70/50; H05B 33/10
  See application file for complete search history.

(56) References Cited

U.S. PATENT DOCUMENTS

| | | | |
|---|---|---|---|
| 2011/0052813 A1* | 3/2011 | Ho | B82Y 30/00 427/256 |
| 2014/0179040 A1* | 6/2014 | Ramadas | B32B 27/20 438/27 |
| 2014/0332078 A1 | 11/2014 | Guo et al. | |
| 2015/0144196 A1 | 5/2015 | Irwin et al. | |
| 2016/0079552 A1* | 3/2016 | Su | H01L 51/0032 136/260 |
| 2017/0037277 A1 | 2/2017 | Oh | |
| 2017/0256745 A1 | 9/2017 | Choi | |

OTHER PUBLICATIONS

J. Burschka et al., Sequential deposition as a route to high-performance perovskile-sensitized solar cells, Article in Nature—Jul. 2013, DOI: 10.1038/nature12340—Source: PubMed.

H.P. Zhou et al., Interface engineering of highly efficient perovskite solar cells, Science, Aug. 1, 2014 • vol. 345 Issue 519.

M.A. Green et al., The emergence of perovskile solar cells, Article in Nature Phoionics—Jul. 2014, DOI: 10.1038/NPHOTON.2014.134.

M.J. Yang et al., Facile Control of Ultraphobicity and Superhydrophilicity in TiO2/Poly{methyl melhacrylale) Composite rilms, Journal of Colloid and Interface Science 368, 603 (2012).

Saadi Research et al., in Science, Preparation and Engineering and Characterization Technology, of Graphene Oct. 1 2015, PMMA vol. 2, Composite, Issue 10, p. International 902-903, Journal highlight of Advanced.

* cited by examiner

HIGHLY STABLE ELECTRONIC DEVICE EMPLOYING HYDROPHOBIC COATING LAYER

CROSS-REFERENCE TO RELATED APPLICATIONS

This application is a divisional application claiming priority from U.S. application Ser. No. 16/098,926, filed on Nov. 5, 2018, entitled "HIGHLY STABLE ELECTRONIC DEVICE EMPLOYING HYDROPHOBIC COMPOSITE COATING LAYER," which was a U.S. national stage application filed under 35 U.S.C. 371 for PCT International Application No. PCT/US17/031657, filed on May 9, 2017, which claims priority under 35 U.S.C. § 119(e) from U.S. provisional patent application No. 62/335,845, filed on May 13, 2016, entitled "HIGHLY STABLE ELECTRONIC DEVICE EMPLOYING HYDROPHOBIC COMPOSITE COATING LAYER," the contents of which are incorporated herein by reference.

BACKGROUND OF THE INVENTION

1. Field of the Invention

The present invention relates to electronic devices, such as, without limitation, solar cells and light emitting diodes, and more particularly to a highly stable electronic device, such as a perovskite solar cell, that includes a hydrophobic composite coating layer for protecting the electronic device from environmental conditions such as humid air and radiant heat.

2. Description of the Related Art

Solar energy has attracted huge attention as a promising alternative to fossil fuel energy (which is regarded as a major source of the green-house effect). However, to replace fossil fuel energy on a worthwhile scale, the manufacturing costs of solar cells need to be decreased and/or the power conversion efficiency of solar cells need to be increased. Recently, organic-inorganic perovskite semiconductors, such as halide perovskite ($CH_3NH_3PbX_3$, X=halogen ions), have been found to be an excellent light absorber for use in creating highly efficient and economically viable solar cells, known as halide perovskite solar cells (PSCs). Halide perovskites have outstanding optical and electronic properties, such as a high absorption coefficient ($>10^4$ cm$^{-1}$), a long carrier diffusion length (>1 μm), high carrier mobility (25 cm$^2$/Vs), and a suitable band gap spanning the energy of visible and near infrared light. In addition, simple and cheap synthesis processes can be applied to the large scale production of halide PSCs. Thus, this emerging hybrid solar cell has the potential to meet the urgent need for low cost and high efficiency power generation.

The first types of PSCs were similar to liquid electrolyte base dye-sensitized solar cells except that a halide perovskite was used as the light absorber. The power conversion efficiency (PCE) of such devices was about 3.8%. These devices, however, had critical stability problems, since the liquid electrolyte easily dissolved the halide perovskite. Later, the liquid electrolyte was substituted with solid hole transport materials (HTM), 2,2',7,7'-tetrakis(N,N-di-p-methoxyphenylamine)-9,9'-spirobifluorene (Spiro-OMeTAD), and as a result the PCE of PSCs jumped to 9.7%. More recent developments have dramatically improved the material properties and processing techniques of halide perovskites, leading to the appearance of PSCs with a PCE of 22.1%.

Despite these advantages, the commercialization of halide PSCs is still challenging, due to the poor long-term stability of the halide perovskites. In particular, when halide perovskites are exposed to water, heat or visible light, the halide perovskite phase is dissociated into iodide compounds and by-products. While easy degradation is a pressing and urgent issue, there are relatively few studies on improving the long-term stability of halide PSCs.

One way to increase the stability of PSCs is to modify the perovskite layer. In one example, Br$^-$ ions are incorporated to the I$^-$ site of methyl ammonium lead iodide (MALI, $CH_3NH_3PbI_3$) to form a more stable structure than pure MALI. In other examples, new organic-inorganic compositions, such as $(PEA)_2(MA)_2Pb_3I_{10}$, $(5-AVA)_x(MA)_{1-x}PbI_3$, have been tested. In addition, the HTM layer of the solar cells has also been modified to improve the stability of PSCs. In one example, single-wall carbon nanotubes are added to the organic polymer matrix of the HTM to help PSCs maintain their performance at high temperature and humidity. Also, the dopant-free tetrathiafulvalene derivative is reported to enhance the durability of PSCs, since HTM does not contain deliquescent additives such as lithium compounds used in Spiro-OMeTAD.

One more very promising way to circumvent the degradation problem is to coat an additional passivation layer onto the PSC. For example, an $Al_2O_3$ buffer layer between the perovskite layer and the metal electrode can reduce shunting degradation by inhibiting a direct contact between the metal electrode and the perovskite. Also, when $TiO_2$ nanoparticles are coated with a thin oxide shell of $Sb_2S_3$, $Y_2O_3$, MgO, direct contact between $TiO_2$/perovskite interfaces are blocked and the degradation rate of the perovskite is reduced. Deposition of a hydrophobic polytetrafluoroethylene layer onto the top side of PSCs can also protect the halide perovskite from ambient humidity.

None of these methods, however, have proven to be both effective and commercially viable.

SUMMARY OF THE INVENTION

In one embodiment, an electronic device, such as, without limitation, a perovskite solar cell or a light emitting diode, is provided that includes an assembly including at least one electronic portion or component, and a composite coating layer covering at least part of the assembly including the at least one electronic portion or component. The composite coating layer includes a polymer material (e.g., including an oxygen atom or atoms), such as, without limitation, polymethyl methacrylate (PMMA), polyurethane (PU), or a PMMA-PU mixture, having nanoparticles, such as, without limitation, graphene oxide, reduced graphene oxide, $ZnO_2$, $ZrO_2$, $CeO_2$, $SnO_2$ or $SiO_2$, embedded therein. The electronic device may further include a second coating layer including a second polymer material (such as, without limitation, PMMA, PU or PMMA-PU without nanoparticles) positioned between the coating layer and the assembly.

In another embodiment, a method of making an electronic device is provided. The method includes forming an assembly including at least one electronic portion or component, and depositing a composite coating layer over at least part of the assembly including the at least one electronic portion or component, wherein the composite coating layer comprises a polymer material having nanoparticles embedded therein.

The method may further include forming a second coating layer including a second polymer material without embedded nanoparticles between the coating layer and the assembly, wherein the coating layer and the second coating layer have different levels of hydrophobicity.

DETAILED DESCRIPTION OF EXEMPLARY EMBODIMENTS

Figure 1:
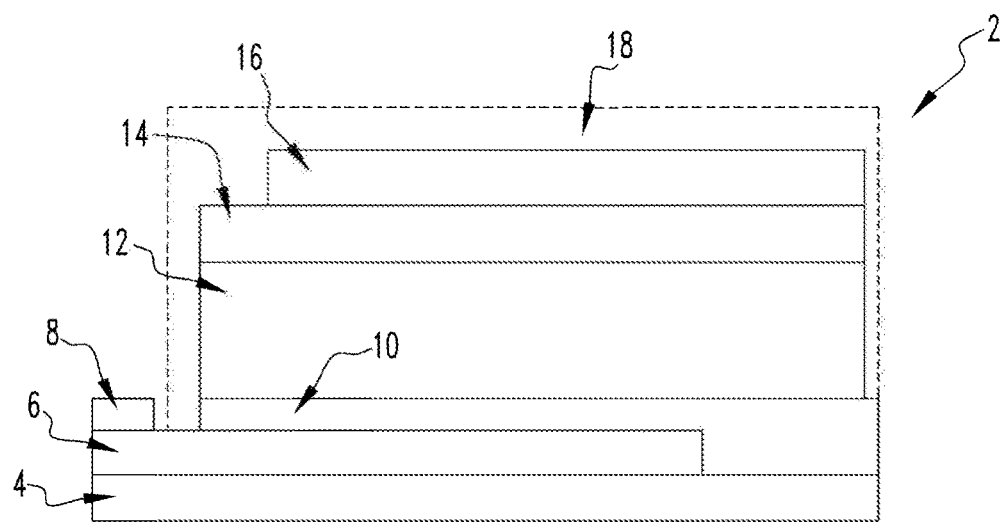
FIG. 1 is a schematic diagram of a perovskite solar cell according to an exemplary embodiment of the disclosed concept.

As used herein, the singular form of "a", "an", and "the" include plural references unless the context clearly dictates otherwise. As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, "fixedly coupled" or "fixed" means that two components are coupled so as to move as one while maintaining a constant orientation relative to each other.

As used herein, the word "unitary" means a component is created as a single piece or unit. That is, a component that includes pieces that are created separately and then coupled together as a unit is not a "unitary" component or body.

As used herein, the statement that two or more parts or components "engage" one another shall mean that the parts exert a force against one another either directly or through one or more intermediate parts or components.

As used herein, the term "number" means one or an integer greater than one (i.e., a plurality).

As used herein, the term "nanoparticle" means an object that behaves as a whole unit with respect to its transport and properties having a size (e.g., diameter or width) ranging from 1 to 100 nm.

As used herein, the term "nanosheet" means a two-dimensional nanostructure with thickness in a scale ranging from 1 to 100 nm.

As used herein, the term "embedded" means placed or positioned within a surrounding mass.

As used herein, the term "polymer" means a natural or synthetic chemical compound that is made of small molecules that are arranged in a simple repeating structure to form a larger molecule.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The present invention will now be described, for purposes of explanation, in connection with numerous specific details in order to provide a thorough understanding of the subject invention. It will be evident, however, that the present invention can be practiced without these specific details without departing from the spirit and scope of this innovation.

FIG. 1 is a schematic diagram of a perovskite solar cell 2 according to an exemplary embodiment of the disclosed concept. Perovskite solar cell 2 includes a glass or plastic substrate layer 4 which serves as a structural support or base layer for perovskite solar cell 2. Substrate layer 4 is the layer on which the other layers of perovskite solar cell (described below) are fabricated. A transparent electrode 6 is provided on the top surface of substrate layer 4. Transparent electrode 6 allows light to be transmitted inside of perovskite solar cell 2. Transparent electrode 6 also functions to deliver the electricity that is generated by perovskite solar cell 2 to an external load. In one non-limiting exemplary embodiment, transparent electrode 6 is made of fluorine doped tin oxide (FTO) or indium tin oxide (ITO). A metal electrode 8, made of, for example without limitation, gold (Au) or silver (Ag), is provided on a portion of the top surface of transparent electrode 6. The function of metal electrode 8, like transparent electrode 6, is to deliver the electricity that is generated by perovskite solar cell 2 to an external load. A compact layer 10 made of, for example and without limitation, inorganic nanoparticles or conducting polymers, is provided on top of a portion of the top surface of transparent electrode 6 and a portion of the top surface of substrate 4. The function of compact layer 10 is to prevent the combination perovskite and electron transport material layer 12 (described below) from contacting transparent electrode 6. A combination perovskite and electron transport material layer 12 is provided on the top surface of compact layer 10. As the name implies, combination perovskite and electron transport material layer 12 includes a perovskite material (or, alternatively, a different organic light absorbing material) and an electron transport material. The function of the perovskite material (or other organic light absorber) is to absorb light and convert it to electricity. The function of the electron transport material is to filter holes and let only electrons travel to transparent electrode 6. In the non-limiting exemplary embodiment, the perovskite material is a halide perovskite such as lead iodide perovskite ($CH_3NH_3PbI_3$), and the electron transport material is $TiO_2$, although other suitable materials are contemplated within the scope of the present invention. A hole transport material layer 14 is provided on the top surface of perovskite and electron transport material layer 12. In the non-limiting exemplary embodiment, hole transport material layer 14 is made of Spiro-OMeTAD, although other suitable materials are contemplated within the scope of the present invention. The function of hole transport material layer 14 is to filter electrons and let only holes travel from combination perovskite and electron transport material layer 12 to metal electrode 16 described below. A metal electrode 16, made of, for example without limitation, gold (Au) or silver (Ag), is provided on a portion of the top surface of hole transport material layer 14. The function of metal electrode 16 is to deliver the electricity that is generated by perovskite solar cell 2 to an external load. Finally, a hydrophobic coating layer 18 is provided over and encapsulates metal electrode 16, hole transport material layer 14, perovskite and electron transport material layer 12, and at least the top surface of compact layer 10. As described in more detail herein, hydrophobic coating layer 18 functions as a passivation layer which protects perovskite solar cell 2 from moisture and/or heat, thereby improving the chemical and thermal stability of perovskite solar cell 2.

Hydrophobic coating layer 18 is a composite, nanoparticle-embedded polymer coating layer. In other words, hydrophobic coating layer 18 comprises a polymer material, such as a transparent thermoplastic or mixture of transparent thermoplastics, having nanoparticles embedded therein. In one exemplary embodiment, the polymer of hydrophobic coating layer 18 is poly(methyl methacrylate) (PMMA). In another exemplary embodiment, the polymer of hydrophobic coating layer 18 is a mixture of PMMA and polyurethane (PU) (denoted PMMA-PU). Also in the exemplary embodiments, the nanoparticles embedded in the polymer and forming part of hydrophobic coating layer 18 are oxide nanoparticles. In one particular exemplary embodiment, the nanoparticles are in the form of a reduced graphene oxide (rGO) nanosheet, and hydrophobic coating layer 18 is a poly(methyl methacrylate) (PMMA)/reduced graphene oxide (rGO) passivation layer or a PMMA-PU/rGO passivation layer. In another exemplary embodiment, the nanoparticles are in the form of $SiO_2$, and hydrophobic coating layer 18 is a poly(methyl methacrylate) (PMMA)/$SiO_2$ or PMMA-PU/$SiO_2$ passivation layer (i.e., the oxide nanoparticles in this alternative embodiment are $SiO_2$ nanoparticles, which are typically spherical in shape).

Hydrophobic coating layer 18 in the illustrated embodiment changes the wettability of the surface of perovskite solar cell 2. In particular, a typical bare PSC surface exhibits hydrophilic surface properties with a contact angle (CA) of approximately 44.7°. A PSC having a passivation layer consisting solely of PMMA exhibits hydrophilic surface properties with a CA of approximately 69.0°. The present inventors have determined, however, that when hydrophobic coating layer 18 (in the form of a poly(methyl methacrylate) (PMMA)/reduced graphene oxide (rGO) passivation layer or a PMMA-PU/rGO passivation layer) is provided as part of perovskite solar cell 2 as described above, the surface of perovskite solar cell 2 becomes hydrophobic. In particular, it has been found that the CA of such a perovskite solar cell 2 can be increased to 85.2° or higher.

An increase in the CA of perovskite solar cell 2 as just described suggests that the hydroxyl group of the rGO nanosheet attracts the carbonyl group (COOH) of ambiphilic PMMA molecules containing both hydrophilic and hydrophobic organic groups. The electrostatic attraction between hydrophilic oxides and the carbonyl group of PMMA reorients the methyl methacrylate (MMA). Hence, only hydrophobic components of PMMA are exposed to the surface of the oxide-PMMA composites. This reorientation of PMMA explains an increase in the CA of the rGO added PMMA.

Hydrophobic coating layer 18 also improves the thermal stability of perovskite solar cell 2. In particular, the present inventors have found that when hydrophobic coating layer 18 (in the form of a poly(methyl methacrylate) (PMMA)/reduced graphene oxide (rGO) passivation layer or PMMA-PU/rGO passivation layer) is provided as part of perovskite solar cell 2 as described above, hydrophobic coating layer 18 helps to dissipate heat from substrate layer 4 to the ambient environment due to the superior thermal conductivity of rGO. Quick dissipation of heat through hydrophobic coating layer 18 containing rGO prevents heat accumulation and temperature increase in perovskite solar cell 2. Consequently, the thermal damage of hole transport material layer 14 is minimized. Thus, hydrophobic coating layer 18 has the potential to elongate the lifetime of perovskite solar cell 2 by stabilizing the doped hole transport material layer 14.

In the exemplary embodiment, perovskite solar cell 2 having hydrophobic coating layer 18 (in the form of a poly(methyl methacrylate) (PMMA)/reduced graphene oxide (rGO) passivation layer or PMMA-PU/rGO passivation layer) is manufactured in the following manner First, layers 4, 6, 8, 10, 12, 14 and 16 are manufactured using any known or hereafter developed manufacturing technique in order to form the base perovskite solar cell assembly that comprises those layers. To create hydrophobic coating layer 18, an rGO nanosheet is synthesized using a modified Hummers' method as described in, for example, G. S. Han, Y. H. Song, Y. U. Jin, J.-W. Lee, N.-G. Park, B. K. Kang, J.-K. Lee, I. S. Cho, D. H. Yoon, H. S. Jung, ACS Appl. Mater. Interface 7 (2015) 23521-23526. Next, PMMA (Mw~15,000) is dissolved in chlorobenzene (various wt % e.g., (0, 10, 20, 30 wt %) may be used). The rGO nanosheet is then added to the PMMA or PMMA-PU solution according to a predetermined weight ratio (e.g., PMMA:rGO weight ratio of 99:1). To avoid aggregation, the solution is then sonicated for a predetermined period, such as one hour. The solution is then applied to the base perovskite solar cell assembly described above using a suitable technique such as tape-casting or spin coating (e.g., 3000 rpm for 30 sec).

Thus, the use of hydrophobic coating layer 18 has been shown to provide superior protection performance for perovskite solar cell 2 due to improved hydrophobicity and increased tortuosity of $O_2$ or $H_2O$ diffusion path, and increased heat dissipation through hydrophobic coating layer 16. In particular, the present inventors have been able to demonstrate that such a perovskite solar cell 2 demonstrates improved aging characteristics (i.e., suppresses aging), even at extreme conditions of greater than 75% humidity and/or greater than 85° C. temperature. In addition, the bending capability of hydrophobic coating layer 18 means that flexible perovskite solar cells 2 can be created for use in wearable electronic devices or other devices that need to be able to flex. Furthermore, the hydrophobic surface of hydrophobic coating layer 18 allows perovskite solar cells 2 to be compatible with human skin, which is rich in sweat composed of water and corrosive cations.

Figure 2:
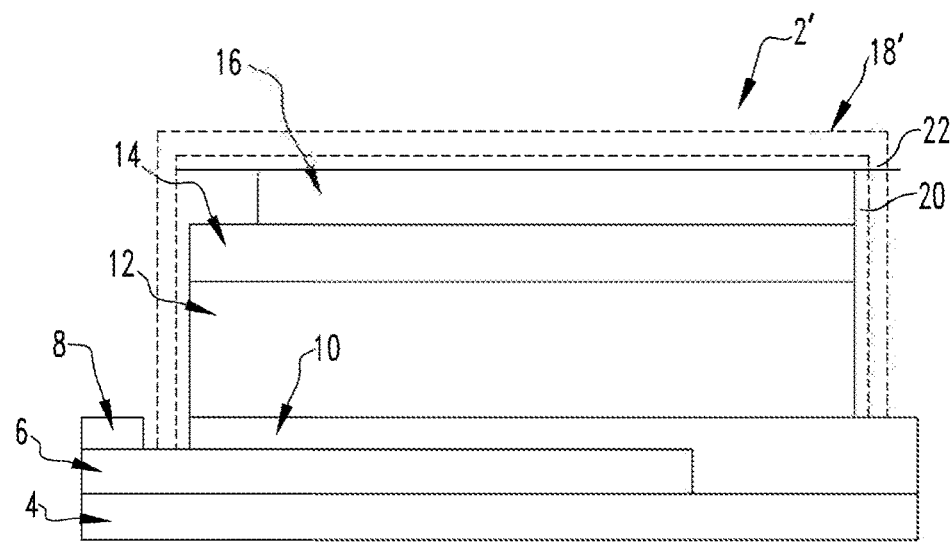
FIG. 2 is a schematic diagram of a perovskite solar cell according to an alternative exemplary embodiment of the disclosed concept.

FIG. 2 is a schematic diagram of a perovskite solar cell 2' according to an alternative exemplary embodiment of the disclosed concept. Perovskite solar cell 2' includes many of the same components as perovskite solar cell 2, and like components are labeled with like reference numerals. However, perovskite solar cell 2' includes an alternative coating layer 18' that consists of two sub-layers, one deposited on top of the other. In particular, alternative coating layer 18' includes a hydrophilic sub-layer 20 and a hydrophobic sub-layer 22 deposited on top of hydrophilic sub-layer 20. In one exemplary embodiment, hydrophilic sub-layer 20 is a polymer material such as PMMA (without any embedded nanoparticles), and hydrophobic sub-layer 22 is a composite, nanoparticle-embedded polymer coating layer. In another exemplary embodiment, the polymer of hydrophilic sub-layer 20 is PMMA-PU (without any embedded nanoparticles), and hydrophobic sub-layer 22 is a composite, nanoparticle-embedded polymer coating layer. In one particular embodiment, hydrophobic sub-layer 22 comprises PMMA with $SiO_2$ nanoparticles embedded therein (for example, and without limitation, 50 wt % $SiO_2$). In another particular embodiment, the polymer of hydrophobic sub-layer 22 is PMMA-PU having the $SiO_2$ nanoparticles embedded therein. In still other embodiments, the $SiO_2$ nanoparticles may be replaced with other oxide nanoparticles such as reduced graphene oxide as described herein.

The present inventors have found that, in certain applications, a PMMA-PU layer may be more effective at suppressing water permeation and degradation of the perovskite phase as compared with a pure PMMA layer, as a pure PMMA layer may allow for water permeation under very humid conditions. In particular, under very humid conditions (e.g., over 95% humidity) cracks which provide further paths for water permeation may develop in a pure PMMA layer, whereas under similar conditions such cracks do not develop in a PMMA-PU layer. This indicates that the addition of PU slows down water permeation under such conditions due to the interpenetration of PU and PMMA molecule chains which forms tangled and interconnected fibrillar networks.

In the exemplary embodiment, perovskite solar cell 2' is formed by first forming layers 4, 6, 8, 10, 12, 14 and 16 using any known or hereafter developed manufacturing technique in order to form the base perovskite solar cell assembly that comprises those layers. Coating layer 18' is then formed on top of the base perovskite solar cell assembly using a 2-step coating process.

In perovskite solar cell 2', the role of hydrophilic sub-layer 20 is to capture moisture which may exist inside combination perovskite and electron transport layer 12. More specifically, hydrophilic sub-layer 20 is able to pump out residual water which is absorbed inside of perovskite solar cell 2' during synthesis and storage, and acts as a hygroscopic desiccant. The role of hydrophobic sub-layer 22, on the other hand, is to block the penetration of humidity from outside of perovskite solar cell 2' and therefore keep perovskite solar cell 2' dry. In particular, the oxygen containing moieties, such as the ester group of the poly(methyl methacrylate) and the carbonyl group of the polyurethane rotate toward the oxide nanoparticles surface and form bonds through van der Waals force. As a result, the ester group bonded to the $SiO_2$ nanoparticles is not easily hydrolyzed in the humid ambience and the hydrophilicity of the PMMA is dramatically reduced.

In a further alternative embodiment, both sub-layer 20 and sub-layer 22 are composite, nanoparticle-embedded polymer coating layers having different levels of hydrophobicity as a result of including different amounts/concentrations of oxide nanoparticles therein. More specifically, sub-layer 22 will have a greater concentration of oxide nanoparticles and sub-layer 20 so as to create a gradient in the hydrophobicity of coating layer 18'.

Figure 3:
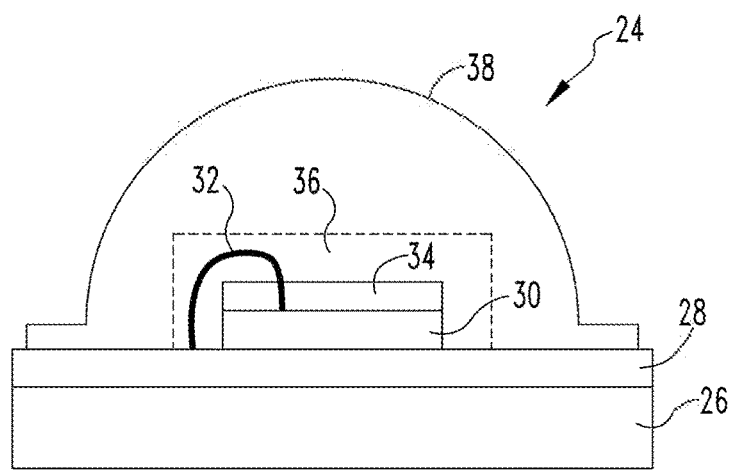
FIG. 3 is a schematic diagram of a light emitting diode according to an alternate embodiment of the disclosed concept.

Furthermore, while in the exemplary embodiments described above in connection with FIGS. 1 and 2 coating layers 18 and 18' have been used in connection with an electronic device in the form of a solar cell, namely a perovskite solar cell, it will be understood that this is meant to be exemplary only and not limiting. Thus, the passivation layer according to the disclosed concept may be used with other types of electronic devices in order to increase the stability of the device in environmental conditions that include high humidity levels. For example, and without limitation, FIG. 3 is a schematic diagram of a light emitting diode (LED) 24 according to an alternate embodiment of the disclosed concept. As seen in FIG. 3, LED 24 includes a substrate 26, such as a ceramic substrate, and an electrode 28 provided on substrate 26. An LED chip or die 30 is provided on electrode 28 (the terms chip and die are used interchangeably herein). LED chip or die 30 is electrically connected to electrode 28 by wire bond 32. A phosphor layer 34 covers the top surface of LED chip or die 30. In addition, according to an aspect of the disclosed concept, a coating layer 36 is provided over LED chip or die 30, phosphor layer 34, and wire bond 32. Coating layer 36 is a composite, nanoparticle-embedded polymer coating layer, and may take the form of either coating layer 18 or coating layer 18' (i.e., a double layer with a hydrophobicity gradient) described in detail herein. Thus, coating layer 36 increases the stability of LED 24 by providing a barrier against moisture and helping to dissipate heat as described in detail elsewhere herein in connection with coating layers 18, 18'. Finally, a lens 38, made of a material such as, without limitation, epoxy, silicone, acrylic, or some other polymer material, is provided on electrode 28 and encloses LED chip or die 30, wire bond 32, phosphor layer 34, and coating layer 36.

The passivation layer of the disclosed concept may further be employed with other electronic devices including, without limitation, photodetectors, field effect transistors and imaging sensors.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A method of making an electronic device, comprising:
    forming an assembly including at least one electronic portion or component; and
    depositing a composite coating layer over at least part of the assembly including the at least one electronic portion or component, wherein the composite coating layer comprises an ambiphilic polymer material containing both hydrophilic and hydrophobic organic groups and having nanoparticles embedded therein, wherein the nanoparticles comprise one or more of reduced graphene oxide (rGO), graphene oxide, $CeO_2$, and $SnO_2$.

2. The method according to claim 1, wherein the electronic device is a solar cell, and wherein the forming comprises forming a solar cell assembly including a light absorbing layer, the at least one electronic portion or component comprising the light absorbing layer.

3. The method according to claim 2, wherein the solar cell is a perovskite solar cell and wherein the light absorbing layer comprises a perovskite.

4. The method according to claim 3, wherein the solar cell assembly also includes a plurality of electrodes, hole transport material provided on a first side of the perovskite, and electron transport material provided on a second side of the perovskite.

5. The method according to claim 1, wherein the polymer material comprises a transparent thermoplastic.

6. The method according to claim 1, wherein the polymer material comprises poly(methyl methacrylate).

7. The method according to claim 6, wherein the polymer material comprises a mixture of poly(methyl methacrylate) and polyurethane.

8. The method according to claim 1, wherein the polymer material comprises poly(methyl methacrylate).

9. The method according to claim 8, wherein the nanoparticles are provided as a graphene sheet or a reduced graphene oxide nanosheet.

10. The method according to claim 1, wherein the polymer material comprises poly(methyl methacrylate), polyurethane or a mixture of poly(methyl methacrylate) and polyurethane.

11. The method according to claim 1, further comprising forming the composite coating layer including embedding the nanoparticles in the polymer material.

12. The method according to claim 8, further comprising forming the composite coating layer.

13. The method according to claim 12, wherein the forming the composite coating layer includes forming a reduced graphene oxide nanosheet, dissolving the poly(methyl methacrylate) or polyurethane in a solvent to form a solution, and adding the reduced graphene oxide nanosheet to the solution.

14. The method according to claim 13, wherein the weight ratio of poly(methyl methacrylate) to reduced graphene oxide is 99:1.

15. The method according to claim 1, further comprising forming a second coating layer between the coating layer and the assembly, wherein the coating layer and the second coating layer have different levels of hydrophobicity.

16. The method according to claim 15, wherein the second coating layer comprises a second polymer material without nanoparticles embedded therein.

17. The method according to claim 15, wherein the wherein the polymer material and the second material both comprise poly(methyl methacrylate).

18. The method according to claim 17, wherein the polymer material and the second polymer material both comprise a mixture of poly(methyl methacrylate) and polyurethane.

19. The method according to claim 15, wherein the second coating layer is a composite coating layer comprising a polymer material having nanoparticles embedded therein, wherein a first concentration of nanoparticles in the coating layer is greater than a second concentration of nanoparticles in the second coating layer.

20. The method according to claim 1, wherein the electronic device is a light emitting diode, and wherein the forming comprises forming a light emitting diode including a light emitting diode die, the at least one electronic portion or component comprising the light emitting diode die.

21. The method according to claim 13, wherein the solvent is chlorobenzine.

* * * * *